US005373149A

United States Patent [19]

Rasmussen

[11] Patent Number: 5,373,149

[45] Date of Patent: Dec. 13, 1994

[54] FOLDING ELECTRONIC CARD ASSEMBLY

[75] Inventor: Kris A. Rasmussen, Tinton Falls, N.J.

[73] Assignee: AT&T Bell Laboratories, Murray Hill, N.J.

[21] Appl. No.: 11,603

[22] Filed: Feb. 1, 1993

[51] Int. Cl.[5] .................... G06K 19/06

[52] U.S. Cl. .................... 235/492; 235/487

[58] Field of Search .................... 235/487, 492

[56] References Cited

U.S. PATENT DOCUMENTS

| | | | |
|---|---|---|---|
| 4,842,531 | 6/1989 | Takemura | 439/165 |
| 4,885,430 | 12/1989 | Kinser, Jr. et al. | 174/254 |
| 5,004,899 | 4/1991 | Ueda | 235/492 |
| 5,061,845 | 10/1991 | Pinnavaia | 235/492 |

*Primary Examiner*—Harold Pitts

*Attorney, Agent, or Firm*—Christopher N. Malvone

[57] ABSTRACT

A PCMCIA wireless credit card modem is fabricated using two credit card sized sections interconnected by a hinge. The first section contains modem circuitry, and the second section contains an antenna and radio circuitry. The two sections form a 90 degree angle in the open position. The section with the modem circuitry fits into a type I or II PCMCIA slot in a portable computer, and the section with the antenna remains on the outside of the computer. The folding electronic card assembly can interface to several different PCMCIA card slots. In one embodiment, the first section fits within a Type I or Type II PCMCIA slot, and when in the closed position, the assembly fits within a Type III or Type IV PCMCIA slot.

10 Claims, 4 Drawing Sheets

FOLDING ELECTRONIC CARD ASSEMBLY

BACKGROUND OF THE INVENTION

1. Technical Field

The present invention relates to electronic assemblies, and more particularly to folding electronic card assemblies.

2. Description of the Prior Art

Electronic card assemblies are gaining importance with the expanding portable computer market. These small electronic assemblies, which are sometimes referred to as PCMCIA devices (Personal Computer Memory Card International Association), plug into equipment such as portable computers, palm top computers, lap top computers and personal communication devices, to provide additional features such as extra memory, extra programming, modem capabilities and facsimile capabilities. An example of this type of electronic assembly can be found in U.S. Pat. No. 5,061,845 entitled "Memory Card". In an effort to expand the use of PCMCIA devices, the dimensions of these devices have been standardized. The standardization of these devices has broadened their acceptance by the consumer; however, the small standard sizes minimize the amount of circuitry that can be included in a PCMCIA device. Additionally, with the growing popularity of wireless communications, it is desirable to have PCMCIA wireless modems; however, prior art PCMCIA configurations do not provide a desirable location for an antenna.

SUMMARY OF THE INVENTION

The present invention provides a folding electronic card assembly that satisfies the standard dimensions for PCMCIA devices while providing extra space to mount additional circuitry. The additional space not only provides room for additional circuitry, but it also provides a desirable location for an antenna that supports wireless communications. The folding electronic assembly also offers the advantage of interfacing to several different size PCMCIA slots.

An embodiment of the present invention comprises a first section with an electronic component and a second section with an additional electronic component. A hinge connects the first and second sections so that the sections can move between an open position and a closed position. A connector provides an electrical interface between the electronic card assembly and a portable computer.

In another embodiment of the present invention, a second connector is provided so that another electrical interface is provided to the electronic card assembly. The second connector is part of the second section of the folding assembly and the first connector is part of the first section of the folding assembly.

In yet another embodiment of the present invention, a first section with a first electronic component, a second section with a second electronic component and a third section with a third electronic component am interconnected using hinges. A first hinge connects the first and second sections so that they can move between an open and closed position, and a second hinge connects the second and third sections so that they can move between an open and closed position. This embodiment also comprises a connector that provides an electrical interface between the electronic card assembly and a portable computer.

In still another embodiment of the present invention, a first section has an electronic component and a second section has a transmitter and/or receiver for transmitting and/or receiving information. A connector provides an electrical interface between the electronic card assembly and a portable computer, and a hinge connects the first and second sections so that they can move between an open and closed position.

DETAILED DESCRIPTION

Figure 1:
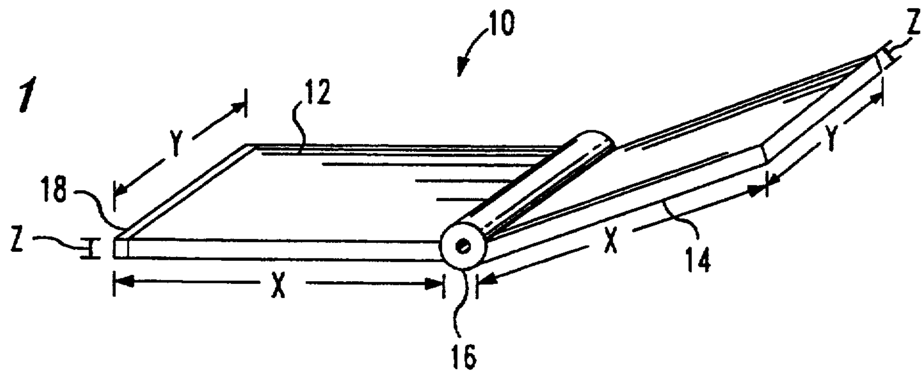
FIG. 1 illustrates a folding electronic card assembly in an open position.

FIG. 1 illustrates folding electronic card assembly 10 in an open position. Sections 12 and 14 are interconnected by hinge 16 so that they can move between an open and closed position. Connector 18 is positioned at the end of section 12 and is typically used to interface to a mating connector in a PCMCIA slot of an external piece of equipment such as a portable computer.

Figure 2:
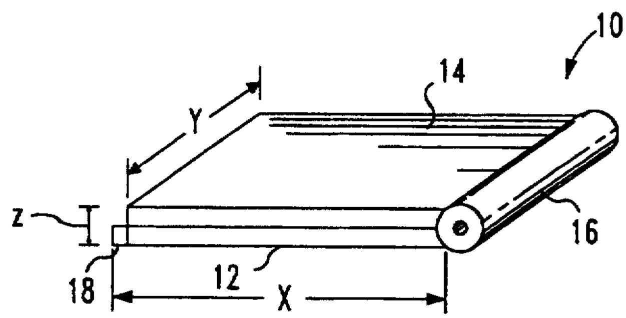
FIG. 2 illustrates a folding electronic card assembly in a closed position.

FIG. 2 illustrates electronic card assembly 10 in a closed position. Section 14 has been rotated using hinge 16 so that it is parallel and adjacent to section 12. It is preferrable to manufacture section 12 with an x-dimension of approximately 85.6 mm, a y-dimension of approximately 54.0 mm and a z-dimension of approximately 3.3 mm so that it can fit within a Type I PCMCIA card slot. It is also preferable to manufacture section 14 with an x-dimension of less than approximately 80 mm, a y-dimension of approximately 54.0 mm and a z-dimension of less than approximately 6.2 mm so that the closed electronic card assembly can fit within a Type III or Type IV PCMCIA slot. The closed electronic card assembly has an x-dimension of approximately 85.6 mm, a y-dimension of approximately 54.0 mm and a z-dimension of approximately 9.5 mm. These dimensions are smaller than a Type III standard PCMCIA card (85.6 mm$\times$54.0 mm$\times$10.5 mm), and PCMCIA card (85.6 mm$\times$54.0 mm$\times$18 mm). Therefore, the folded assembly can fit within a Type III or Type IV PCMCIA card slot.

Figure 3:
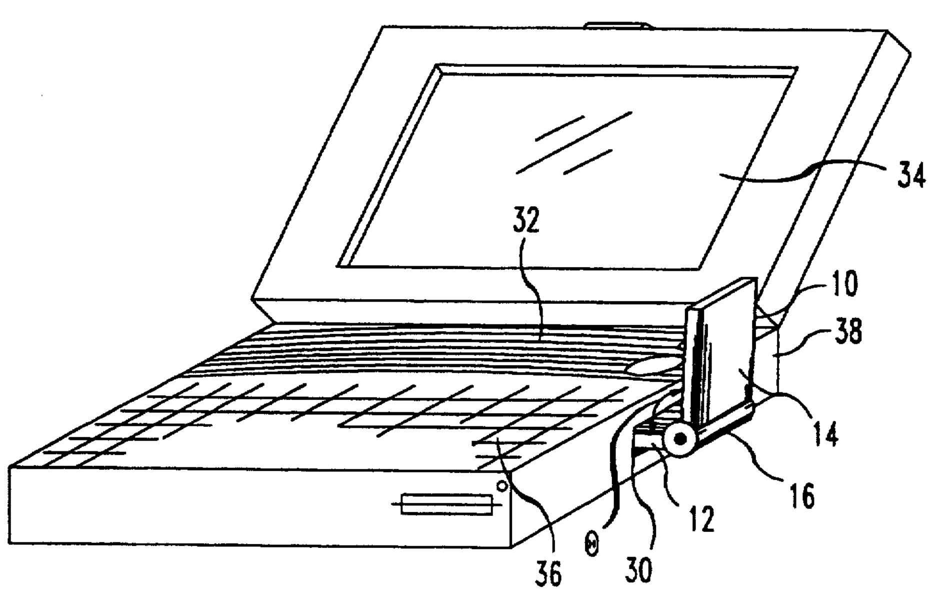
FIG. 3 illustrates a folding electronic card assembly that is plugged into a standard PCMCIA slot of a portable computer.

FIG. 3 illustrates section 12 of folding electronic card assembly 10 inserted into Type I PCMCIA slot 30 of portable computer 32. Slot 30 is typically a Type I slot in palm top computers, and slot 30 is typically a Type II slot in lap top computers. Portable computer 32 includes display 34 and keyboard 36. Section 12 of electronic folding card assembly 10 is in slot 30 and connector 18 on the end of section 12 interfaces to a mating connector within slot 30. Section 14 remains outside of slot 30. In a preferable embodiment, section 14 remains parallel to surface 38 of portable computer 32. Positioning section 14 parallel to surface 38 maintains the portable computer's convenient shape, and reduces the probability of accidentally impacting section 14. The maximum angle between sections 12 and 14 can be controlled by including stops in hinge 16. The stops are used to restrict the amount of rotation permitted by hinge 16. In this example, the stops in hinge 16 do not allow angle Θ to exceed 90 degrees. It is also possible to use multiple stops so that hinge 16 can be set in one of several positions.

Folding electronic card assembly 10 offers a great deal of flexibility by interfacing to several types of PCMCIA slots. Assembly 10 interfaces to a Type I or Type II slot by positioning the assembly in the open position and by inserting section 12 into the slot. Section 12 fits within a Type I or Type II slot because a Type II slot is larger than a Type I slot, and section 12 was manufactured to fit within a Type I slot. In addition, assembly 10 interfaces to a Type III or Type IV slot by positioning the assembly in the closed position and by inserting the assembly into the slot.

Figure 4:
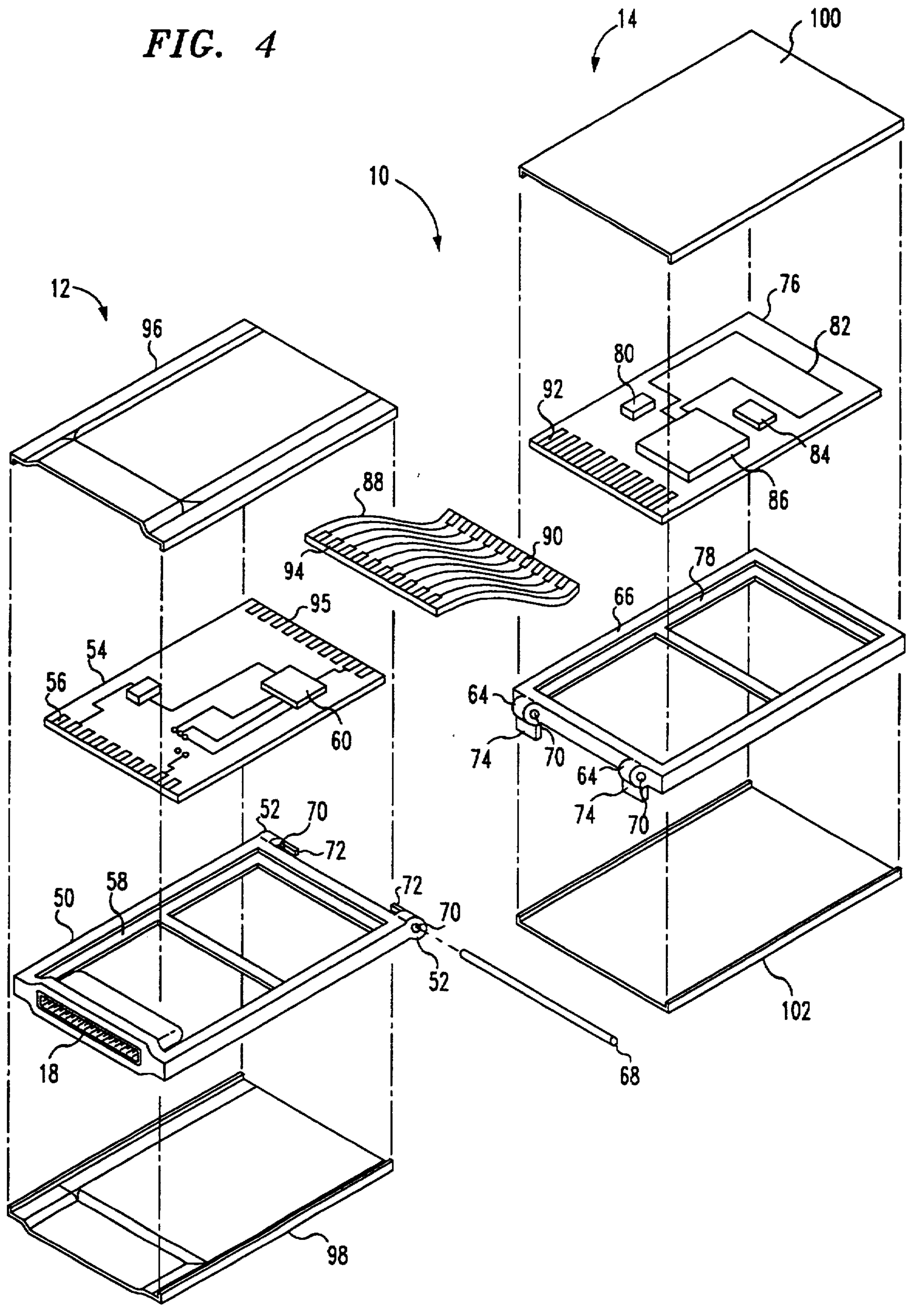
FIG. 4 is an exploded view of a folding electronic card assembly.

FIG. 4 illustrates an exploded view of folding electronic card assembly 10. Section 12 of the electronic card assembly comprises frame section 50. Frame section 50 has connector 18 at one end and outer hinge sections 52 at an opposite end. Connector 18 is used to provide an electrical interface to a mating connector within an external device such as a portable computer. Connector 18 is in electrical contact with circuit card 54 via contacts 56. Circuit card 54 is received by frame 50 and is supported by ledge 58. Card 54 can include any variety of electronic components 60 that are required to support the function that the PCMCIA device is to perform. These functions can include providing extra memory, extra programing, a modem or a facsimile. Outer hinge sections 52 are connected to inner hinge sections 64 of frame 66 using pin 68. Hinge sections 52 and 64 are assembled to form hinge 16 by placing inner hinge sections 64 between outer hinge sections 52 so that pin holes 70 are co-linear. Pin 68 is inserted through pin holes 70 to provide a rotational axis. Hinge sections 52 and 64 may include stops 72 and 74, respectively. Stops 72 and 74 interact to restrict the range of rotation of hinge 16, and thereby limit the maximum angle of separation between sections 12 and 14.

Circuit card 76 is received by frame 66 and is supported by ledge 78. Circuit card 76 can include battery 80, antenna 82, infra-red transceiver 84, transmit/-receive electronics 86 and/or other components that perform functions such as interfacing to a cellular communications system. It is also possible to attach antenna 82 to frame 66, or to fabricate frame 66 with antenna 82 embedded in the material composing frame 66. The components on circuit cards 54 and 76 can be placed on either of the two cards; however, it is preferable to place antenna 82 and/or transceiver 84 in a section that is not inserted into a PCMCIA slot. Flex circuit or flex cable 88 is used to establish an electrical connection between card 54 and card 76. Contacts 90 of flex circuit 88 are connected to contacts 92 of card 76, and contacts 94 of flex circuit 88 are connected to contacts 95 of card 54. This establishes a flexible electrical interface between cards 54 and 76. It is desirable to use a flex circuit or flex cable that has a width that allows it to fit between hinge sections 64.

Lids 96 and 98 are attached to the upper and lower perimeters, respectively, of frame 50 using an adhesive. The lids protect circuit card 54 and its associated electronic components. Similarly, lids 100 and 102 are attached to the upper and lower perimeters of frame 66 using an adhesive. If antenna 82 is included in section 14, lids 100 and 102 should be transparent to the frequencies that antenna 82 is designed to receive and/or transmit. If infra-red transceiver 84 is included in section 14, the portions of lids 100 and 102 that cover transceiver 84 should be transparent to infra-red energy.

Figure 5:
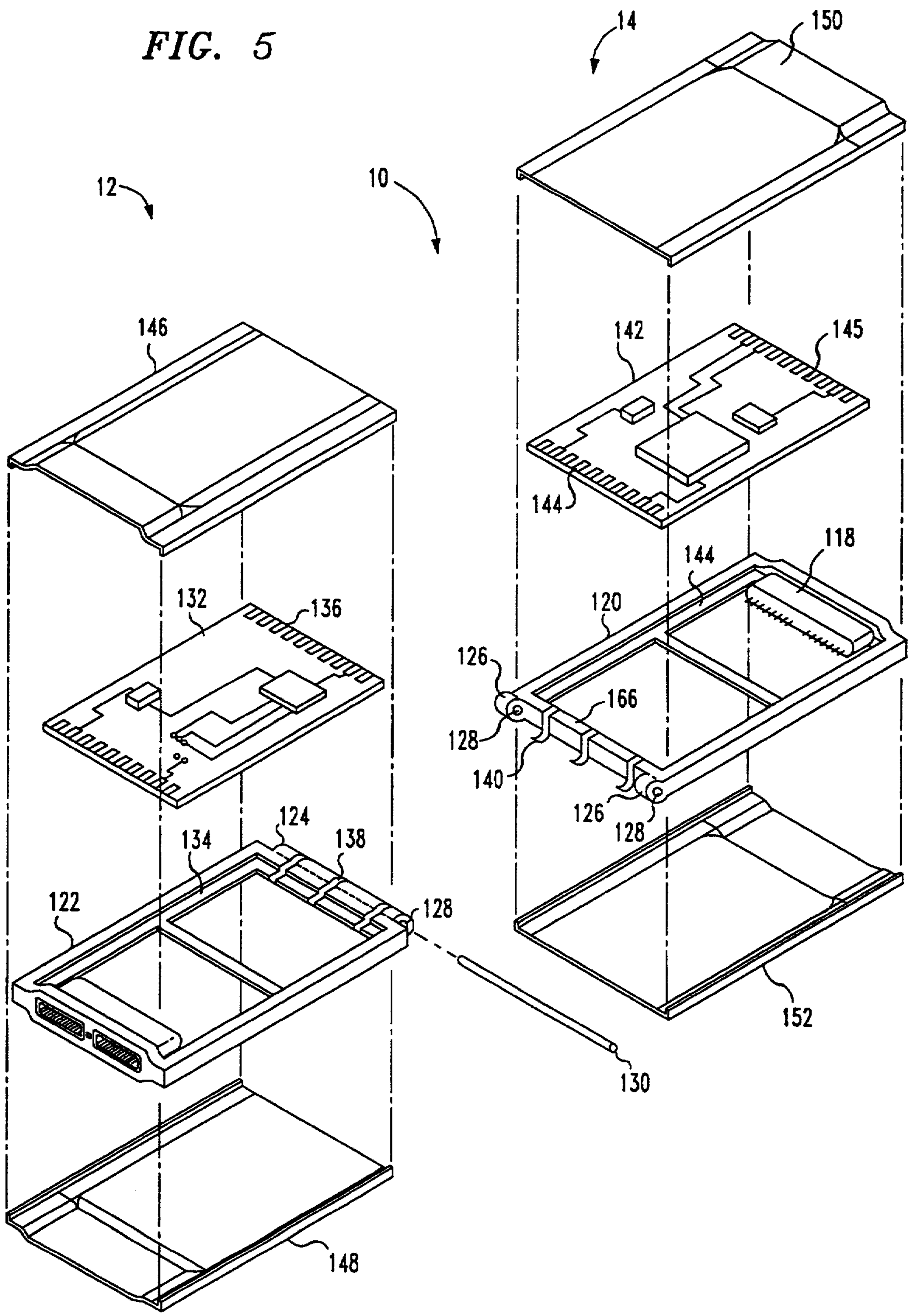
FIG. 5 illustrates a hinge and sliding contact arrangement.

FIG. 5 illustrates an embodiment of the present invention with a slidable contact which replaces flex circuit or flex cable 88, and connector 118 which provides an additional electrical interface to the assembly. Frame 122 includes hinge section 124 and frame 120 includes hinge sections 126. Hinge section 124 fits between hinge sections 126 so that pin holes 128 are co-linear. The two hinge sections are connected by inserting pin 130 through pin holes 128 while the pin holes are in a co-linear relationship. Circuit card 132 is received by frame 122 and is supported by ledge 134. Electrical contacts 136 of card 132 make electrical contact with conductive strips 138. Conductive strips 138 extend around the outer circumference of hinge section 124. When hinge sections 124 and 126 are assembled, conductive strips 138 make electrical contact with j-shaped contacts 140. As hinge sections 124 and 126 are rotated, j-shaped contacts 140 slide along conductive strips 138 to maintain electrical contact. Card 142 has electrical contacts 144 which make electrical contact with j-shaped contacts 140 when card 142 is received by frame 120. Card 142 is supported by ledge 144 of frame 120. The combination of contacts 136, conductive strips 138, j-shaped contacts 140 and contacts 144 maintain an electrical interface between cards 132 and 142. Connector 118 of frame 120 provides an additional electrical interface to the assembly via contacts 145 of card 142. As discussed with regard to FIG. 4, lids 146, 148, 150 and 152 are attached to the frames with an adhesive.

Figure 6:
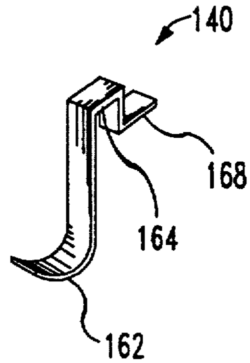
FIG. 6 illustrates a j-shaped contact.

FIG. 6 illustrates a cross-section of j-shaped contact 140. Curved section 162 of j-shaped contact 140 makes electrical contact with conductive strip 138 of hinge section 124 when hinge sections 124 and 126 are joined by pin 130. Bracket section 164 of contact 140 fits tightly over ridge 166 of frame 120, and extension 168 of j-shape contact 140 makes electrical contact with contact 144 of card 142.

Figure 7:
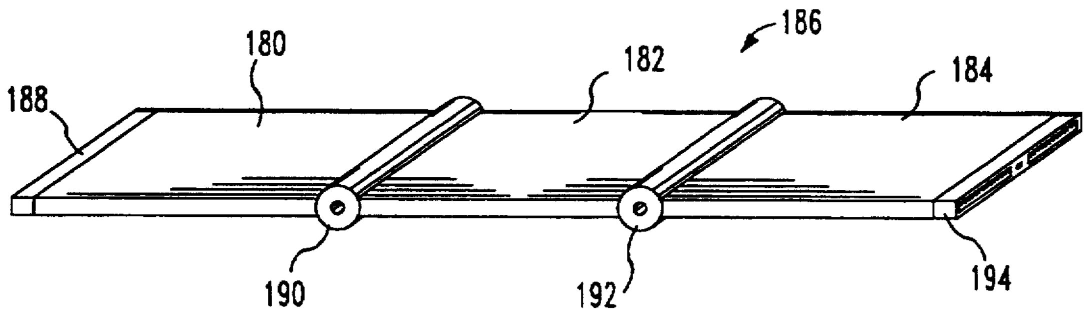
FIG. 7 illustrates a three-section folding electronic card assembly in an open position.

FIG. 7 illustrates another embodiment of the present invention where there are three sections composing a folding electronic card assembly. Sections 180, 182 and 184 compose folding electronic card assembly 186. Connector 188 is used to interface to a mating connector within an external device such as a portable computer. Hinge section 190 connects sections 180 and 182 so that they can rotate about an axis through hinge 190. Hinge 192 interconnects sections 182 and 184 so that they may rotate about an axis through hinge 192. It is also possible to include connector 194 on one end of section 184 to provide an interface between electronic folding card assembly 186 and other devices. It is also possible to place connector 194 or additional connectors at any convenient location on assembly 186.

Figure 8:
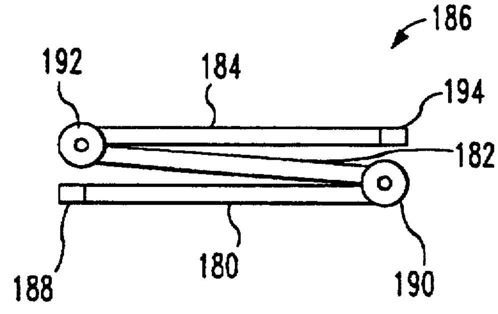
FIG. 8 illustrates a three-section folding electronic card assembly in a partially closed position.

FIG. 8 illustrates assembly 186 in a partially folded or closed position. Section 182 has been rotated using hinge 190 so that section 182 is nearly parallel and adjacent to section 180. Additionally, section 184 has been rotated using hinge 192 so that section 184 is nearly parallel and adjacent to section 182.

I claim:

1. A folding electronic card assembly, comprising:
a first section having an electronic component;
a second section;
transmit means in said second section for transmitting information;
first connector means in said first section for providing an electrical interface to the electronic card assembly; and
hinge means for connecting said first section and said second section so that said sections may be moved between an open position and a closed position.

2. The folding electronic card assembly of claim 1, further comprising flexible conductor means for providing an electrical interface between said first and second sections.

3. The folding electronic card assembly of claim 1, further comprising sliding contact means for providing an electrical interface between said first and second sections.

4. The folding electronic card assembly of claim 1, further comprising a battery.

5. The folding electronic card assembly of claim 1, wherein said transmit means comprises an antenna.

6. The folding electronic card assembly of claim 5, wherein said electronic component is part of a modem.

7. The folding electronic card assembly of claim 1, wherein said transmit means comprises a infrared transceiver.

8. The folding electronic card assembly of claim 7, wherein said electronic component is part of a modem.

9. The folding electronic card assembly of claim 1, further comprising a second connector means in said second section for providing an electrical interface to the electronic card assembly.

10. The folding electronic card assembly of claim 1, wherein said hinge means comprises stop means for restricting a range of rotation of said hinge means.

* * * * *